United States Patent
Prakash (10) Patent No.: US 8,516,315 B2
(45) Date of Patent: Aug. 20, 2013

(54) TESTING OF NON STUCK-AT FAULTS IN MEMORY

(75) Inventor: Suraj Prakash, Greater Noida (IN)

(73) Assignee: STMicroelectronics International N.V., Amsterdam (NL)

( * ) Notice: Subject to any disclaimer, the term of this patent is extended or adjusted under 35 U.S.C. 154(b) by 396 days.

(21) Appl. No.: 12/906,517

(22) Filed: Oct. 18, 2010

(65) Prior Publication Data

US 2012/0060058 A1  Mar. 8, 2012

(30) Foreign Application Priority Data

Sep. 3, 2010 (IN) .......................... 2096/DEL/2010

(51) Int. Cl.
*G11C 29/00* (2006.01)
(52) U.S. Cl.
USPC .......................................... 714/718; 714/719
(58) Field of Classification Search
None
See application file for complete search history.

(56) References Cited

U.S. PATENT DOCUMENTS

| | | | |
|---|---|---|---|
| 5,331,644 A * | 7/1994 | Ishii et al. ...................... 714/736 |
| 7,610,611 B2 | 10/2009 | Moran et al. |
| 7,613,971 B2 * | 11/2009 | Asaka .......................... 714/731 |
| 7,689,878 B2 * | 3/2010 | Azimane ...................... 714/718 |
| 2006/0156193 A1 | 7/2006 | Demange |
| 2007/0033453 A1 | 2/2007 | Azimane |
| 2007/0067706 A1 | 3/2007 | Azimane et al. |
| 2009/0089631 A1 * | 4/2009 | Kanamaru et al. ............ 714/719 |
| 2010/0182854 A1 * | 7/2010 | Takatori ........................ 365/191 |

OTHER PUBLICATIONS

Jone et al., "An Efficient BIST Method for Non-Traditional Faults of Embedded Memory Arrays", 2003 IEEE.*

* cited by examiner

*Primary Examiner* — Gabriel Chu
(74) *Attorney, Agent, or Firm* — Hogan Lovells US LLP (57) ABSTRACT

A method for identifying non stuck-at faults in a read-only memory (ROM) includes generating a golden value of a victim cell, providing a fault-specific pattern through an aggressor cell, generating a test reading of the victim cell in response to the provided fault-specific pattern, and determining whether the ROM has at least one non stuck-at fault. The determination is based on a comparison of the golden value and the test reading of the victim cell.

20 Claims, 4 Drawing Sheets

TESTING OF NON STUCK-AT FAULTS IN MEMORY

RELATED APPLICATION

The present application claims priority of India Application No. 2096/DEL/2010 filed Sep. 3, 2010, which is incorporated herein in its entirety by reference.

TECHNICAL FIELD

The present subject matter relates, in general, to testing of memories and, in particular, to a method and a system for testing non stuck-at faults in such memories.

BACKGROUND

Systematic and automatic testing of integrated circuits (ICs) is becoming increasingly complex as each generation of ICs tends to have a higher component density and increased number of system functionalities than the previous generations. ICs may include numerous functional modules like processors, memory, timers, counters, voltage regulators, etc. The modules may be integrated on a single IC enabling the IC to operate as a standalone system, referred to as a system-on-chip (SOC).

Memory, in particular, forms the largest part of an SOC. The memory may include both read-only memory and read-write memory. Due to dense integration of transistors in the memory, memory particularly, read-only memory (ROM) becomes susceptible to various types of faults, such as stuck-at faults and non stuck-at faults. Examples of non stuck-at faults include, but are not limited to, address decoder delay faults, multiple read faults, and address decoder open faults. Occurrence of any such fault may cause failure of a functionality of the SOC or of the SOC itself. Thus, high complexity and fault sensitivity have made memory testing and diagnosis important.

Testing and diagnosis of a faulty memory helps in identifying the exact location of fault(s) in the memory. Memory testing can be done either externally or internally. External testing offers limited control for embedded memories. For testing the faults internally, test circuits, such as built-in self test (BIST) circuit(s), are fabricated along with the memory.

The BIST circuit generates test patterns and reads contents of the memory in order to test and diagnose the faults present in the memory. This can be done based on a first golden signature. Upon determining a fault, the BIST circuit outputs contents of the memory to a tester for further diagnosis and correction. Such testers have a limited memory and data transfer speed, thus increasing the time taken for debugging the memory.

For detection of address decoder open faults, reading of the contents of the memory cells corresponding to a shifted address and a base address is performed by the BIST circuit. Based on the contents of the memory cells corresponding to the shifted address, a multiple input shift register (MISR) generates a signature, and the signature is used in subsequent comparisons. A comparison of the signature generated by the MISR with a second golden signature yields whether or not the address decoder open faults are present. However, such a scheme may inadvertently cause the contents of the shifted address to be corrupted if the address open decoder faults are present in an address decoder corresponding to the base address.

Moreover, masking of faults or aliasing has also been observed in testing schemes utilizing the MISR. The probability of aliasing is higher for certain algorithms having a complexity O $(n, \log_2 n)$, n being the number of words that have to be tested. Some schemes propose solutions for removal of aliasing and error cancellation through introduction of extra signatures. However, an increased number of signatures results in undue consumption of memory area, silicon area overhead, and increased BIST complexity.

SUMMARY

This summary is provided to introduce concepts related to testing of faults, such as non stuck-at faults, present in a read-only memory (ROM). The concepts are further described below in the detailed description. This summary is not intended to identify essential features of the claimed subject matter nor is it intended for use in determining or limiting the scope of the claimed subject matter.

In one embodiment, a method for testing the ROM for non stuck-at faults is described. A method and a system for identifying non stuck-at faults in the ROM includes generating a golden value of a victim cell. A fault-specific pattern is then provided through an aggressor cell. Subsequently, the victim cell is read and its value is stored as a test reading. Further, it is determined whether the ROM has at least one non stuck-at fault, based on a comparison between the golden value and the test reading of the victim cell.

BRIEF DESCRIPTION OF THE DRAWINGS

The detailed description is provided with reference to the accompanying figures. In the figures, the left-most digit(s) of a reference number identifies the figure in which the reference number first appears. The same numbers are used throughout the drawings to reference like features and components. For simplicity and clarity of illustration, elements in the figures are not necessarily to scale.

DETAILED DESCRIPTION

Presently, electronic components, such as memory, processor, analog-to-digital converters, and digital-to-analog converters, of electronic devices can be fabricated together on a single system-on-chip (SOC). Such SOCs may also include a plurality of densely packed transistors within the memories of the electronic devices, such as computers, laptops, mobile phones, and set-top boxes. The memories, particularly read-only memories (ROMs), may suffer from a high level of functional and environmental stress, and fabrication faults, for example stuck-at faults and non stuck-at faults. The non stuck-at faults include, but are not limited to, address decoder open faults, address decoder delay faults, multiple read faults (MRFs), etc.

Therefore, testing and diagnostic methods are designed to identify faults and their exact position in the memory. In case of read-only memories (ROMs), self-testing mechanisms, such as Built-In Self Test (BIST) mechanisms, are generally employed. A typical BIST mechanism conducts a self-test or a series of self-tests to determine if any memory faults are present.

Different tests need to be performed for different types of faults. In addition to detecting faults in one or more memory cells of a memory array, it is also required to detect faults in circuit elements. Circuit elements are used to control access to the memory cells. Examples of the circuit elements include one or more address decoders, which are provided in association with the memory array to activate particular rows and/or columns of the memory array depending on an address provided to the address decoders. Such an address decoder may potentially suffer from non stuck-at faults such as address decoder open faults (ADOFs), interchangeably referred to as open faults. The open faults are primarily caused by a missing contact or via during the manufacturing process.

As an illustration of the open faults, consider a row address decoder configured to activate a particular wordline in the memory array. Typically, in a fault-free row address decoder, only one wordline is expected to be active at any point in time. Hence, it is desired that during a read operation, data such as logic high '1' or logic low '0' be read only from the relevant memory cell in that activated wordline. However, if an open fault exists in one of the transistors of the address decoder, a possibility of incorrect data read may surface when a new address, say a shifted address, is provided to activate another wordline. In such a scenario, a previously selected wordline may not be de-selected, and the new wordline appropriate to the new address is activated. Accordingly, two wordlines may be simultaneously activated, and the data may end up being read incorrectly. Generally, the incorrect reading may also depend on the data stored in the memory cells. It will be appreciated that similar open faults may occur in column address decoders configured to activate bitlines in the memory array.

Conventional testing of the address decoder for open faults includes individually checking each transistor present within the address decoder. For example, every p-channel transistor in a NAND-based address decoder, and every n-channel transistors in a NOR-based address decoder, can be checked for determining the presence of one or more open faults. Checking the transistors typically involves reading the contents of the memory cells corresponding to a base address and, subsequently, reading the contents of the memory cells corresponding to the shifted address.

To further understand the conventional algorithm of detecting open faults, consider a memory array having multiple memory cells, each arranged at an intersection of a wordline and a bitline. To access a particular memory cell, a corresponding wordline and bitline are selected through their respective address decoders. The memory cells have stored data thereon. The memory cells may be classified into base cells and shifted cells. The shifted cells are generally considered to be the cells that are at a hamming distance of one from the base cell. The testing of the memory cells is performed with respect to a base cell and its corresponding shifted cells. A base address is the address of the base cell, while the shifted address is the address of the shifted cell. For testing, the base cell is read, followed by reading of shifted cells. The complexity of such an algorithm can be denoted as $O(n, \log_2 n)$, where n is the number of memory words that have to be tested.

In some schemes, four cells that are direct neighbors, i.e., a distance of one unit from the base cell, may be treated as shifted cells. Depending on the implementation, other neighboring cells at a distance of two, four, eight, and sixteen units can be read successively.

Typically, after the shifted cells are read by the BIST circuit and a signature is generated by the multiple input shift register (MISR), a final signature is compared with a golden or pre-computed signature for the identification of the address decoder open faults. Such a golden signature is also stored within the memory along with another golden signature used exclusively for testing other memory faults. However, the use of the MISR introduces issues such as aliasing and error cancellation. These issues get further aggravated based on the complexity of test algorithms. In addition, the storage of the golden signature exclusively for the testing of open faults consumes a substantial memory. It will be noted that with an increase in complexity of the SOC, the amount of data to be stored in a ROM has also increased tremendously. Since the tester has a limited memory and speed for diagnosing the open faults, such diagnosis can be time consuming.

Similarly, other non stuck-at faults such as address delay decoder faults may also occur in the ROM. The address decoder delay faults occur when, during a read operation, a memory cell is selected after a delay. As an illustration, this may happen due to a fault in one of the n-channel transistors in a NAND-based address decoder or p-channel transistors in a NOR-based address decoder. Conventionally, the address decoder delay faults are tested by a first reading of a memory cell and then a second reading of another memory cell whose address is complementary to the memory cell's address. The second reading is provided as an input to the MISR. Similar to the conventional schemes for testing address decoder open faults, the testing of address decoder delay faults is associated with aliasing and error cancellation issues due to the MISR. Moreover, the debugging is both time and memory consuming from the perspective of a tester.

The embodiments described herein will help address the aforementioned issues in addition to providing several other advantages over existing testing schemes for the non stuck-at faults in the memory. In an implementation, a golden value of a victim cell is generated. The golden value can be understood as a true or uncorrupted value for the victim cell. Once the golden value is generated, a fault-specific pattern is applied to identify whether the victim cell is corrupted or not. For example, an aggressor cell may be used to determine whether the victim cell is vulnerable to faults. Post fault-sensitization, the victim cell is read and its value may be stored as a test reading of the victim cell.

Subsequently, the golden value is compared with the test reading of the victim cell. In another implementation, a fault-specific pattern in itself is capable of providing a value for comparison with the golden value. Additionally, the location of the open fault is accurately determined based on at least one of an aggressor address and a victim address of the aggressor cell and the victim cell, respectively. Further, a diagnosis stream having at least the victim address corresponding to the faulty circuit element may be outputted to a tester for further diagnosis. Based on the size of the memory array, various schemes may be used to ensure that maximum number of non stuck-at faults can be captured.

The system and method for testing address decoders described herein are independent of the MISR. As a result, aliasing and error cancellation does not occur. Additionally, since the golden value of the victim cell is dynamically computed, the need for storing a fault-specific signature in the ROM does not arise. This leads to substantial saving of area on the memory as well as diagnosis time as the computations are done at run time.

While aspects of the described testing of the non stuck-at faults can be implemented in any number of different systems, circuitries, environments, and/or configurations, the embodiments are described in the context of the following exemplary system(s) and circuit(s). Additionally, the word "connected" is used throughout for clarity of the description and can include either a direct connection or an indirect connection. The descriptions and details of well-known components are omitted for simplicity of the description.

Although the devices are explained herein as certain n-channel and p-channel devices, it can be appreciated that complementary devices are also possible in accordance with the present subject matter. Accordingly, the logic level of control signals can either be active low or active high. It will be appreciated by those skilled in the art that the words "during," "while," and "when" as used herein are not exact terms that mean an action takes place instantly upon an initiating action but that there may be some small but reasonable delay, such as a propagation delay, between the initial action, and the reaction that is initiated by the initial action.

Figure 1:
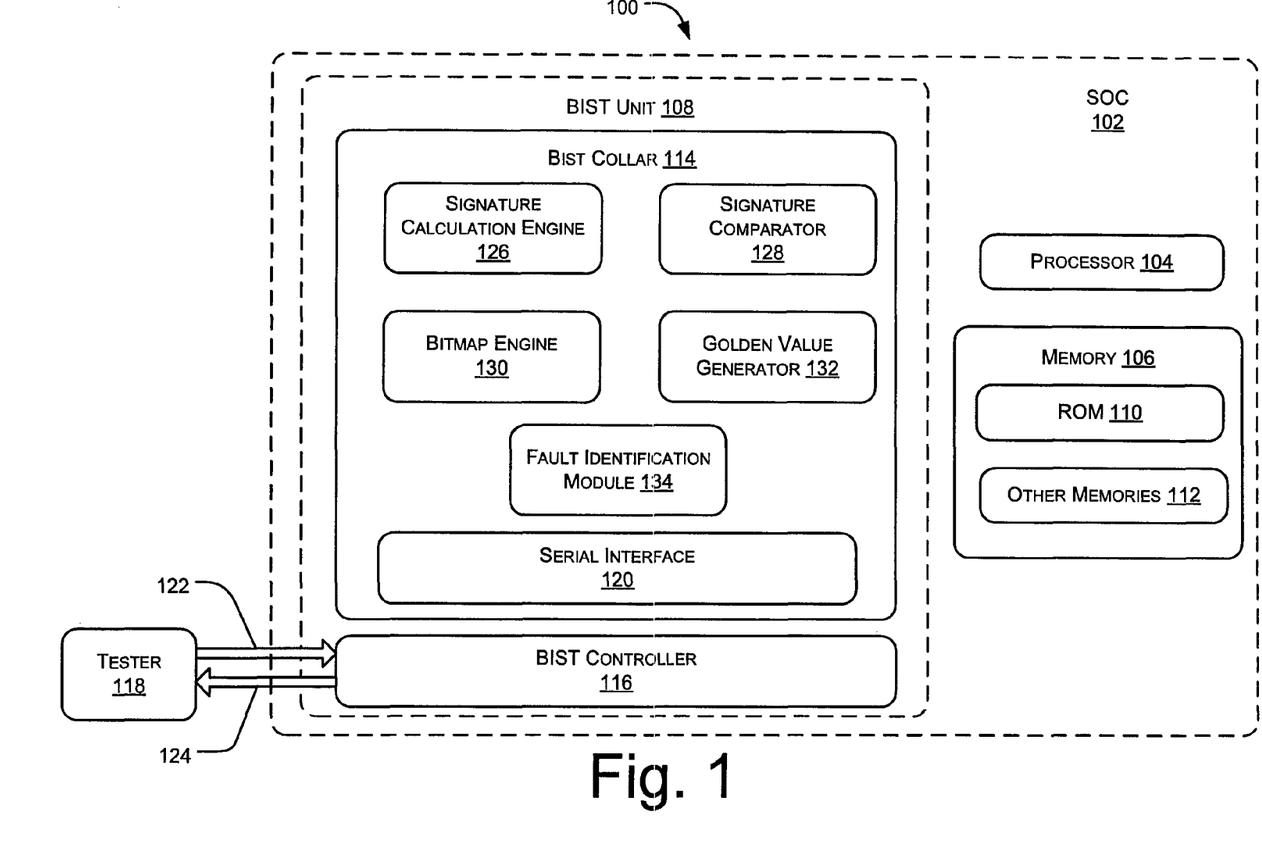
FIG. 1 illustrates an exemplary system for testing a read-only memory (ROM) for non stuck-at faults, in accordance with an embodiment of the present subject matter.

FIG. 1 illustrates an exemplary system 100 for testing a read-only memory (ROM) for non stuck-at faults, such as address decoder open faults (ADOFs) and address decoder delay faults, in a Built-In Self Test (BIST) environment. The system 100 includes a system-on-chip (SOC) 102. The SOC 102 includes all functional elements of an electronic device, in which the SOC 102 is to be implemented, on a single IC. The SOC 102 may be implemented in various electronic devices, for example a computer, a mobile phone, a set-top box, a laptop, etc.

In an embodiment, the SOC 102 includes a processor 104, a memory 106, and a BIST unit 108. The processor 104 can be a single processing unit or a combination of multiple processing units. The processor 104(s) may be implemented as one or more microprocessors, microcomputers, microcontrollers, digital signal processors, central processing units, state machines, logic circuitries, and/or any devices that manipulate signals based on operational instructions. Among other capabilities, the processor(s) 104 is configured to fetch and execute computer-readable instructions stored in the memory 106.

The memory 106 includes a ROM 110, on which testing is performed, and other memories 112. The ROM 110 may store program code or fixed data, for example, a look-up table, a dictionary, etc., which may facilitate functioning of the SOC 102. The ROM 110 also includes circuit elements, such as address decoders (not shown in this figure). The other memories 112 may include any other memories besides ROM 110 that may be present on the SOC 102. Examples of the other memories 112 include, but are not limited to, volatile or non-volatile memories, such as SRAMs, DRAMs, SDRAMs, EEPROMs, flash drives, etc.

In said embodiment, the BIST unit 108 includes a BIST collar 114 and a BIST controller 116. The BIST unit 108 is configured to test the ROM 110 to identify one or more non stuck-at faults, for example, ADOFs (interchangeably referred to as open faults), multiple read faults (MRFs), and address decoder delay faults. Additionally, the BIST unit 108 may also be configured to test stuck-at faults as well. For example, the BIST controller 116 receives test signals from a tester 118 requesting the ROM 110 to be tested. The BIST controller 116 sends control signals to the BIST collar 114 for testing the ROM 110.

In one implementation, the BIST collar 114 checks every memory cell in a sequential manner. Accordingly, the BIST collar 114 transfers test data, such as a diagnosis stream having an aggressor address or a victim address or both, to the BIST controller 116 through a serial interface 120. The BIST controller 116, in turn, shifts out the diagnosis stream to the tester 118. In the present illustration, an input bus 122 and an output bus 124 facilitate exchange of the diagnosis stream. The addresses may be indicative of the location of the non stuck-at fault in the ROM 110.

In said embodiment, the BIST collar 114 includes a signature calculation engine 126, a signature comparator 128, and a bitmap engine 130. The signature calculation engine 126 and the signature comparator 128 together detect other faults, such as stuck-at faults, in the ROM 110. However, for testing the non stuck-at faults, the BIST unit 108 includes a golden value generator 132 and a fault identification module 134. Further, for the diagnosis of both non stuck-at faults and stuck-at faults, the BIST unit 108 includes the bitmap engine 130.

In operation, the BIST unit 108 receives test signals from the tester 118. Based on the test signals, the golden value generator 132 generates a golden value of a victim cell. In one embodiment, the golden value is a true or uncorrupted value of the victim cell. Once the golden value is generated, the golden value generator 132 is further configured to stress a fault-specific pattern or perform fault sensitization to identify whether the victim cell is corrupted or not. For example, an aggressor cell may be used to determine whether the victim cell is vulnerable to faults. Further, the victim cell is read after the fault sensitization. Such a value may be hereinafter referred to as a test reading of the victim cell. Subsequently, the fault identification module 134 compares the golden value with the test reading of the victim cell. It should be noted that the test reading of the victim cell may not always be required. In some cases, the fault-specific pattern is capable of providing a value for comparison with the golden value.

As an illustration, consider a scenario in which the ROM 110 is tested for address decoder delay faults. Such faults are tested by reading the victim cell a number of times, for example 3 times. This is followed by a reading of the aggressor cell, which provides the fault sensitization. Subsequently, the victim cell is read, this reading is stored as the test reading of the victim cell. Further, the last reading of the victim cell, during a first read sequence while generating the golden value, and the test reading of the victim cell are compared. Accordingly, an address decoder delay fault is identified. In this scenario, the victim cell is a complement of the aggressor cell.

In an implementation, the bitmap engine 130 is used for diagnosis. For diagnosis of non stuck-at faults, the bitmap engine 130 outputs at least one of the victim address and the aggressor address to the tester 118, which, based either on the aggressor address or the victim address or both, determines the exact location of the non stuck-at fault. It will be appreciated that the victim address is the address of the victim cell and the aggressor address is the address of the aggressor cell. It will be understood that even though the description has been explained with reference to an open fault in the address decoder, the description can be extended to other circuit elements and other types of non stuck-at faults such as address decoder delay faults, MRFs, etc.

Figure 2:
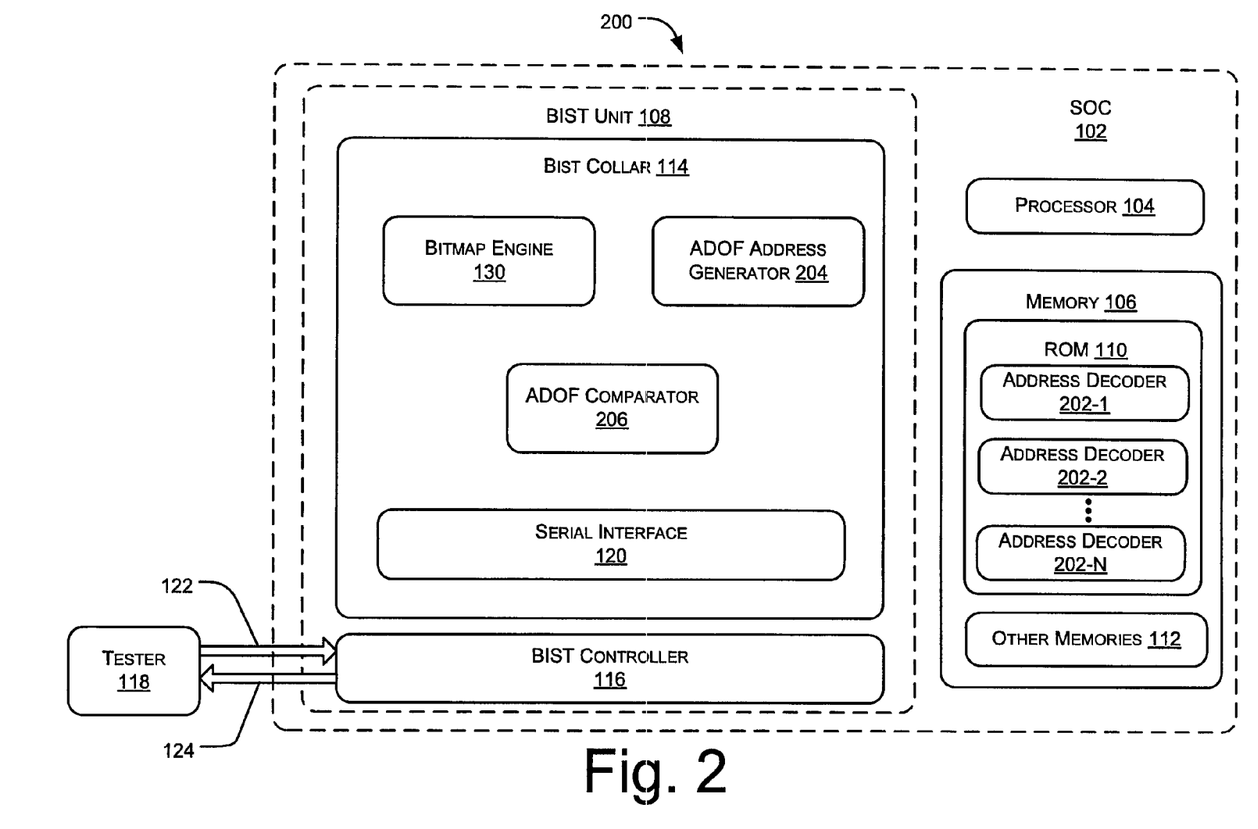
FIG. 2 illustrates an exemplary system for testing address decoder open faults in the ROM, in accordance with an embodiment of the present subject matter.

FIG. 2 illustrates an exemplary system 200 for testing the read-only memory (ROM) 110 for ADOFs in a BIST environment, in accordance with an embodiment of the present subject matter. In said embodiment, the system 200 includes the SOC 102 having the processor 104, the memory 106, and the BIST unit 108 embedded thereon. As mentioned before, the memory 106 includes the ROM 110 on which the testing is performed. The ROM 110 may include circuit elements such as address decoders 202-1, 202-2, . . . , 202-N, collectively referred to as address decoders 202, for selecting wordlines and bitlines. Further, the address decoders 202 may either be row address decoders or column address decoders for selecting the wordlines and the bitlines.

In one embodiment, the BIST unit 108 is configured to test the ROM 110 to identify one or more ADOFs or open faults. In one example, the open faults occur as a result of an open transistor, for example, a p-channel transistor in the address decoder 202-1, where the address decoder 202-1 is a NAND-type address decoder. In another example, the open faults occur as a result of an open transistor such as an n-channel transistor in the address decoder 202-1 where the address decoder 202-1 is a NOR-type address decoder. It will be understood that even though the description is explained with reference to an open fault in the address decoder 202-1, the description can be extended to all the address decoders 202 as well.

In the present embodiment, the BIST controller 116 receives test signals from the tester 118 requesting for testing the address decoders 202. The test signals indicate the aggressor address of the memory array, which has to be tested. The aggressor address for open faults is referred to as a base address, while the victim address for open faults is referred to as a shifted address. The base address corresponds to the address of the base cell, while the shifted address corresponds to the shifted cell. The BIST controller 116 sends the test signals to the BIST collar 114 for testing the address decoders 202 in the ROM 110.

For testing the ROM 110, the golden value generator 132, in one implementation, is an ADOF address generator 204, and the fault identification module 134 is an ADOF comparator 206. In said embodiment, the ADOF address generator 204 generates a golden value of the shifted cells in the following manner. The ADOF address generator 204 generates a first shifted address SA1 corresponding to a first base address BA1. The ADOF address generator 204 is also configured to generate a first refreshing address RA1.

On reading the contents corresponding to the first refreshing address RA1, previously selected wordlines and bitlines that can corrupt contents of the shifted cell are de-selected. Further, the shifted cell is read. The ADOF address generator 204 dynamically stores such a reading of the shifted cell as a golden value corresponding to the shifted cell. Additionally, the reading of the shifted cell ensures that the wordlines and bitlines corresponding to the first refreshing address RA1 are also de-selected. Further, the base cell is read followed by a step for obtaining a test reading of the shifted cell. This completes one sequence of read operation.

Subsequently, to identify the open faults, the ADOF comparator 206 compares the golden value with the test reading of the shifted cell. The ADOF comparator 206 makes such a comparison in real time thereby removing the need of the MISR and a golden signature exclusive to open faults. As an illustration, consider a case in which an open fault exists in the address decoder 202 corresponding to the base cell. In such a scenario, the comparison by the ADOF comparator 206 yields that a mismatch exists, and the shifted cell reading may have been corrupted as a result of the ADOF in the base cell. In a similar manner, each address is treated as a base address and tested in a sequential manner.

The ADOF address generator 204 is also configured to generate a second refreshing address RA2 to de-select the base address and the shifted address, for the next sequence of read operation, after the comparison is made. This is performed to ensure that the base address and the shifted address of a previous sequence of read operation have been deselected with the help of optimum number of p-channel transistors, as in the case of the NAND-type address decoder 202-1 for generation of golden value of the shifted address of the current read sequence operation. In the next read operation, the ADOF address generator 204 generates the first refreshing address RA1 corresponding to a second shifted address SA2. Once all the shifted addresses corresponding to the base address BA1 are checked, the process is repeated for other base addresses as well. As a result, the entire memory array is scanned to ensure that no open faults exist.

Further, the bitmap engine 130 is used for diagnosis of ROM 110. The bitmap engine 130 keeps an account of the base address and the shifted address for which the mismatch has occurred. The bitmap engine 130 transfers test data such as a diagnosis stream having the base address and the shifted address of at least one faulty address decoder, for example the address decoder 202-1, from amongst the address decoders 202 to the BIST controller 116 through the serial interface 120. The BIST controller 116, in turn, shifts out the diagnosis stream of the faulty address decoder 202-1 to the tester 118. The base address and the shifted address of the faulty address decoder 202-1 may be indicative of the location of the open p-channel transistor in the faulty NAND-type address decoder 202-1. Using such information, the tester 118 may determine the exact location of the open fault. These and other aspects are explained in detail with reference to FIGS. 3(a), (b), and (c).

Figure 3A:
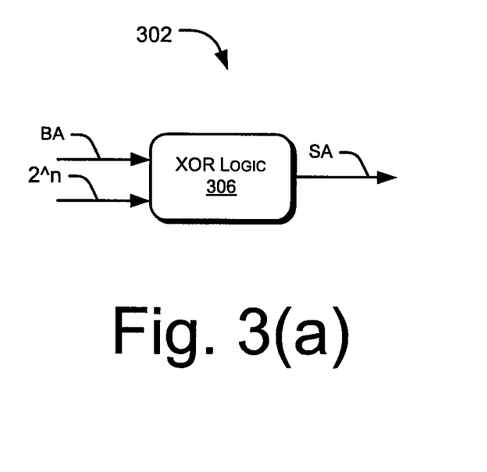
FIGS. 3(a), (b), and (c) illustrate components of an address decoder open faults (ADOF) test generator, in accordance with an embodiment of the present subject matter.
Figure 3B:
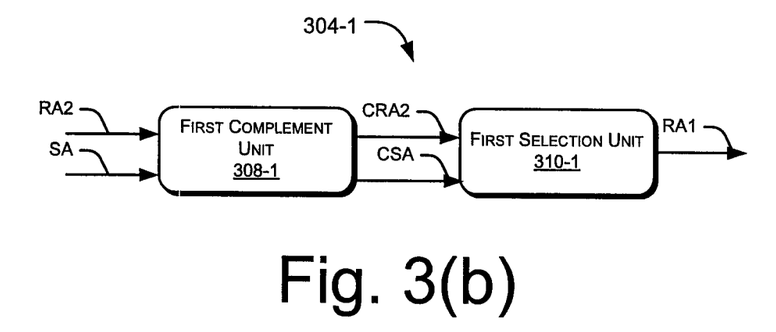
Figure 3C:
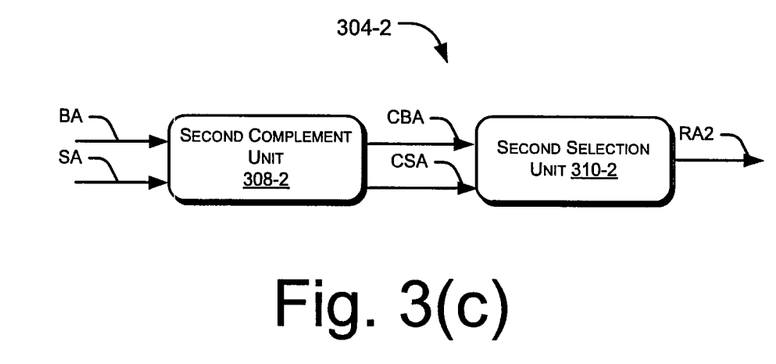

FIGS. 3(a), 3(b), and 3(c) illustrate components of the ADOF address generator 204, in accordance with an embodiment of the present subject matter. The ADOF address generator 204 includes a shifted address generator 302. The ADOF address generator 204 further includes a first refreshing address generator 304-1 and a second refreshing address generator 304-2, as shown in FIGS. 3(b) and 3(c), respectively.

Referring to FIG. 3(a), the shifted address generator 302 includes a XOR logic 306 and receives the base address BA as a first input and $2^n$ as a second input, where n is from 0 to N−1 and N is the number of address bits. The output of the shifted address generator 302 is the shifted address ($SA_1, \ldots, SA_N$), collectively referred to as SA. In one implementation, each shifted address SA is at a hamming distance of one from the base address BA. Each of the shifted addresses, like SA1, SA2, and so forth, corresponding to a base address, like BA1, ensures that only one transistor, say p-channel transistor in a NAND-type address decoder 202-1, is activated at a time for the purpose of de-selection of a wordline or a bitline, as the case may be. For example, if the base address BA1 is (0000), the first shifted address SA1 is (0001), the second shifted address SA2 is (0010), the third shifted address SA3 is (0100), and the fourth shifted address SA4 is (1000). Similarly, for the base address BA2 (0001), the first shifted address SA1 is (0000), the second shifted address SA2 is (0011), the third shifted address SA3 is (0101), and the fourth shifted address SA4 is (1001).

In another embodiment, an exhaustive run could be performed for all possible combinations corresponding to the base address BA. For example, for base address BA1 (000), the shifted addresses are (001), (010), (011), (100), (101), (110), (111).

Conventionally, the memory cell at the base address BA1 is read and then the memory cell at the shifted address SA1 is read. However, it may happen that the reading of a base cell may corrupt the reading of a shifted cell. Thus, in one implementation, a golden value of the shifted cell is generated. For this, the ADOF address generator 204 generates the first refreshing address RA1 and the second refreshing address RA2.

Referring to FIG. 3(b), the first refreshing address generator 304-1 generates the first refreshing address RA1. For this, the first refreshing address generator 304-1 receives a second refreshing address RA2 of a previous sequence of read operation and a shifted address SA of the current sequence of read operation. For the first sequence of read operation, the second refreshing address RA2 may be taken as (0000). Further, the second refreshing address RA2 and the shifted address SA are fed to a first complement unit 308-1. The first complement unit 308-1 is configured to provide a complementary second refreshing address (CRA2) and a complementary shifted address (CSA).

Further, a first selection unit 310-1, which in one implementation may be an alternate bit selection unit, selects an alternate bit from the complementary second refreshing address CRA2 and the complementary shifted address CSA to provide the first refreshing address RA1 for the current sequence of read operation. For example, if the second refreshing address RA2 of a previous sequence of read operation is (1111) and the shifted address SA of the current sequence of read operation is (0010), the first complement unit 308-1 generates CRA2 as (0000) and CSA as (1101). The first selection unit 310-1, in this case, selects alternate bits starting from the least significant bit of the complementary second refreshing address CRA2. Thus, the first refreshing address of the current sequence of read operation is (1000).

The alternate bit selection is particularly helpful when there is a possibility of open faults to occur in pair. This may happen in a NAND-type decoder where two consecutive p-channel transistors may have open faults, whereas in a NOR-type decoder, open faults may be present in two consecutive n-channel transistors. Therefore, selecting two alternate bits for the purpose of de-selection of wordline or bitline may be used.

The generation of the second refreshing address RA2 may be performed using the same logic as that for the first refreshing address RA1, but with different inputs. For RA2, a second complement unit 308-2 receives the base address BA of the current read operation and the shifted address SA of the current sequence of read operation and generates a complementary base address CBA and a complementary shifted address CSA. A second selection unit 310-2 then selects alternate bits from the complementary base address CBA and the complementary shifted address CSA. As an illustration, if the base address BA is (0011) and the shifted address SA is (1011), the second refreshing address RA2 is (0100). In another example, the second refreshing address RA2 may be the complement of the shifted address CSA or the complement of the base address CBA. Thus, the first refreshing address RA1 and the second refreshing address RA2 de-select previously selected wordlines and bitlines by activating as many p-channel transistors as possible, for example in case of the NAND-type address decoder 202-1. This is further explained with reference to the following example in which twelve sequences of read operations are illustrated. Each sequence corresponds to a single base address BA1, BA2, and so on.

| R(RA1): | R(1111) | | | |
| R(SA): | R(0001) | R(0010) | R(0100) | R(1000) |
| R(BA): | R(0000) | R(0000) | R(0000) | R(0000) |
| R(SA): | R(0001) | R(0010) | R(0100) | R(1000) |
| R(RA2): | R(1111) | R(1111) | R(1111) | R(1111) |
| R(SA): | R(0000) | R(0011) | R(0101) | R(1001) |
| R(BA): | R(0001) | R(0001) | R(0001) | R(0001) |

-continued

| R(SA): | R(0000) | R(0011) | R(0101) | R(1001) |
| R(RA2): | R(1110) | R(1110) | R(1110) | R(1110) |
| R(SA): | R(0011) | R(0000) | R(0110) | R(1010) |
| R(BA): | R(0010) | R(0010) | R(0010) | R(0010) |
| R(SA): | R(0011) | R(0000) | R(0110) | R(1010) |
| R(RA2): | R(1101) | R(1101) | R(1101) | R(1101) |

In the above examples of three sequences of read operations, the second refreshing address RA2 is the complement of the base address CBA; and for the first read sequence, the first refreshing address is (1111). As shown, for the first sequence of read operation, the first base address BA1 (0000), the shifted addresses are (0001), (0010), (0100), and (1000). Likewise for the second sequence of read operation, the second base address BA2 (0001), the shifted addresses are (0000), (0011), (0101), and (1001); and for the third base address BA3 (0010), the shifted addresses are (0011), (0000), (0110), and (1010).

It will be understood that even though the description herein provides for de-selection of the wordlines and bitlines using both the first and the second refreshing address RA1 and RA2; however, various other schemes may be used to generate a golden value of the shifted cell. This is further illustrated in subsequent paragraphs.

In another implementation, if the number of address lines is below a predefined number, such as two or three, the test for open faults may be performed using mutual adjustment of the base address BA. For example, in case of four address lines, the base address BA is any of the following: (00), (01), (10), and (11). Consequently, the shifted addresses SA corresponding to the base address BA (00) are (01) and (10).

One of the ways in which maximum number of p-channel transistors may be selected for the de-selection is provided below by way of an example. As shown, R(SA) represents reading a shifted cell and R(BA) represents reading a base cell. The arrows indicate the order in which the shifted addresses SA are read.

As shown, the first or the second refreshing address (RA1, RA2) may not be required after reading the base cell at (00) as the wordline and bitline corresponding to (00) is de-selected due to subsequent steps of reading shifted cells at (01) and (10). Further, the wordline and bitline corresponding to (01) is de-selected by reading the shifted cell at (10).

In yet another implementation, the second refreshing address RA2 alone may be used to de-select the wordlines of the previous read operation. This can be explained with the help of the following example. Here, R (RA2) represents that a memory cell at the second refreshing address RA2 is read.

| R(SA): | R(0000001) | R(0000010) |
| R(BA): | R(0000000) | R(0000000) |
| R(SA): | R(0000001) | R(0000010) |
| R(RA2): | R(1111110) | R(1111101) |

As can be seen, the second refreshing address RA2 (1111110) is responsible for de-selection of the wordlines and bitlines activated by read operations at the shifted address SA (0000001) and the base address BA (0000000). Also, when the hamming distance between the base address BA1 and the base address BA2 is large, say 7, the first refreshing address RA1 may be used.

Figure 4:
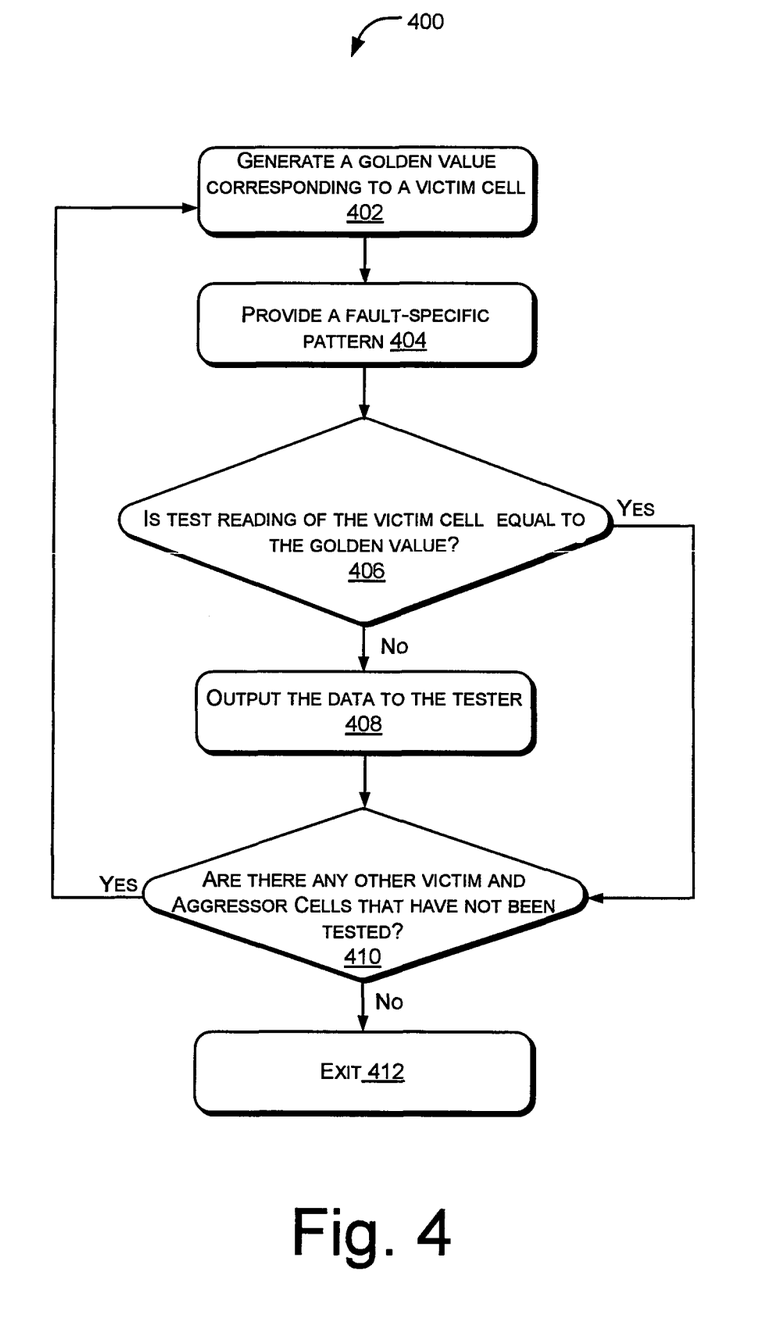
FIG. 4 illustrates an exemplary method for identifying non stuck-at faults in the ROM, in accordance with an embodiment of the present subject matter.

FIG. 4 illustrates an exemplary method 400 for identifying non stuck-at faults in a ROM, in accordance with an embodiment of the present subject matter. The method 400 is described in the context of address decoder open faults, however the method 400 may be extended to cover other faults. Additionally, even though the method 400 is described in the context of the SOC 102, the method 400 is also implementable through computer executable instructions.

The order in which the method 400 is described is not intended to be construed as a limitation, and any number of the described method blocks can be combined in any order to implement the method 400, or an alternative method. Additionally, individual blocks may be deleted from the method 400 without departing from the spirit and scope of the subject matter described herein. Furthermore, the method 400 can be implemented in any suitable hardware, software, firmware, or combination thereof.

At block 402, a golden value corresponding to a victim cell is generated. In an implementation, the golden value of a victim cell is generated by a golden value generator, for example, the ADOF address generator 204. For example, for open faults, the ADOF address generator 204 generates at least one refreshing address to ensure that wordlines and bitlines selected in the previous read operation are de-selected. This ensures that the reading of the victim cell is un-corrupted and is, hence, a golden value. The victim cell is a shifted cell in case of open faults. In another implementation, the golden value, in case of open faults, may be generated by address re-adjustment through which the wordlines and the bitlines for the previous base address are properly de-selected by previous victim address and current victim address, and previous victim address is properly de-selected by the victim address of the current sequence of read operation.

At block 404, a fault-specific pattern is provided. For example, a fault-specific pattern is provided through an aggressor cell. In one implementation, the aggressor cell is read following the generation of the golden value of the victim cell. In case of open faults, an aggressor address is a base address BA corresponding to shifted addresses SA1, SA2, and so on. Further, the victim cell is read again as some value may have been corrupted due to a read operation of the aggressor cell. This value, obtained after fault sensitization, is referred to as test reading of the victim cell.

At block 406, it is determined whether the test reading of the victim cell is equivalent to the golden value of the victim cell. For example, a fault identification module, such as the ADOF comparator 206, compares the two readings of the victim cells at run time. If the two readings are equivalent, the control flows to block 410 ("Yes" branch). However, if the two readings are not same, the control flows to block 408 ("No" branch), in which data, such as the base address BA or the shifted address SA or both of a faulty address decoder, such as the address decoder 202-1, is outputted to the tester 118 and the control further moves to block 410.

At block 410, it is determined whether there are any other victim cells and aggressor cells, which have not been tested. For example, in case of open faults, it is determined whether there are any other shifted addresses that are at a hamming distance of one from the base address. For example, the golden value generator, such as the ADOF address generator 204, determines whether there are any other shift addresses SA corresponding to the base address BA. Additionally, it is also determined whether there are any other base addresses that have not been tested. For example, subsequent to a test of all the shifted addresses corresponding to a base address, the process is repeated for the remaining base addresses. A positive determination ("Yes" branch) makes the control go back to the block 402, while a negative determination ("No" branch) results in the transfer of control to block 412. The testing of the ROM 110 is completed at block 412.

Although embodiments for testing non stuck-at faults in a ROM have been described in language specific to structural features and/or methods, it is to be understood that the invention is not necessarily limited to the specific features or methods described. Rather, the specific features and methods are disclosed as exemplary embodiments for testing of non stuck-at open faults.

I claim:

1. A method for testing a read-only memory (ROM) for at least one non stuck-at fault, the method comprising:
    generating a golden value of a victim cell, wherein the golden value corresponds to an uncorrupted data value of the victim cell;
    providing a fault-specific pattern through an aggressor cell, wherein the aggressor cell is associated with a plurality of victim cells;
    generating a test reading of the victim cell in response to the provided fault-specific pattern; and
    determining whether the ROM has at least one non stuck-at fault based on a comparison of the golden value and the test reading of the victim cell,
    wherein the non stuck-at fault is at least one of an address decoder open fault, an address decoder delay fault, and a multiple read fault.

2. The method as claimed in claim 1 further comprising receiving a test signal for testing the ROM for address decoder open faults.

3. The method as claimed in claim 2, wherein the generating the golden value further comprises:
    obtaining a second refreshing address from a previous read sequence;
    generating a first refreshing address for a current read sequence based at least on the second refreshing address of the previous read sequence; and
    reading the victim cell of the current read sequence, wherein the victim cell is at a pre-determined distance from the aggressor cell.

4. The method as claimed in claim 2, wherein the providing comprises reading the aggressor cell.

5. The method as claimed in claim 2, wherein the generating the golden value further comprises:
de-selecting wordlines and bitlines corresponding to victim cells and aggressor cells of previous read sequences; and
reading the victim cell of a current read sequence, wherein the victim cell is at a pre-determined distance from the aggressor cell.

6. The method as claimed in claim 2, wherein the victim cell is at least one hamming distance apart from the aggressor cell.

7. The method as claimed in claim 1 further comprising:
identifying whether at least another victim cell, from amongst the plurality of victim cells, is present;
based on the identification, determining whether the another victim cell has been read;
if the another victim cell has not been read, then generating a golden value of the other victim cell;
reading the aggressor cell;
generating a test reading of the another victim cell; and
determining whether an address decoder corresponding to the aggressor cell is faulty, based on a comparison between the golden value of the another victim cell and the test reading of the another victim cell.

8. The method as claimed in claim 1 further comprising:
identifying whether at least another aggressor cell is present;
based on the identification, determining whether the another aggressor cell has been read; and
if the another aggressor cell has not been read, then identifying at least one victim cell separated by a predetermined distance from the another aggressor cell.

9. The method as claimed in claim 1, further comprising shifting out at least one of an aggressor address of the aggressor cell and a victim address of the victim cell when the ROM is faulty.

10. The method as claimed in claim 1 further comprising receiving a test signal for testing the ROM for address decoder delay faults.

11. The method as claimed in claim 10, wherein the generating the golden value comprises reading the victim cell for a pre-determined number of times.

12. A system-on-chip (SOC) comprising:
a read-only memory (ROM); and
a built-in self test (BIST) unit coupled to the ROM, the BIST unit comprising,
a golden value generator configured to,
provide a golden value of a victim cell;
provide a fault-specific pattern through an aggressor cell, wherein the aggressor cell is associated with at least one victim cell; and
generate a test reading of the victim cell in response to the fault-specific pattern;
and
a fault identification module configured to identify non stuck-at faults in the ROM based at least on the golden value and the test reading of the victim cell,
wherein the non stuck-at fault is at least one of an address decoder open fault, an address decoder delay fault, and a multiple read fault.

13. The SOC as claimed in claim 12, wherein the BIST unit receives test signals for testing the ROM for address decoder open faults.

14. The SOC as claimed in claim 13, wherein the golden value generator is an address decoder open faults (ADOF) address generator, and wherein the ADOF address generator comprises a shifted address generator to generate at least one victim address.

15. The SOC as claimed in claim 13, wherein the golden value generator further comprises a first refreshing address generator to generate a first refreshing address, the first refreshing address generator comprising:
a first complement unit to generate a complementary address of a second refreshing address and a complementary address of the victim address; and
a first selection unit to alternatively select address bits from the complementary address of the second refreshing address and the complementary address of the victim address.

16. The SOC as claimed in claim 13, wherein the golden value generator further comprises a second refreshing address generator to generate a second refreshing address, the second refreshing address generator comprising a second complement unit to generate a complementary address of an aggressor address and a complementary address of a victim address, and wherein the second refreshing address is one of the complementary address of the aggressor address and the complementary address of the victim address.

17. The SOC as claimed in claim 13, wherein the golden value generator further comprises a second refreshing address generator to generate a second refreshing address, the second refreshing address generator comprises a second selection unit to alternatively select address bits from a complementary address of an aggressor address and a complementary address of a victim address.

18. The SOC as claimed in claim 12 further comprising a bitmap engine to provide a diagnosis stream having at least one of an aggressor address and a victim address, wherein the diagnosis stream indicates a location of the non stuck-at faults.

19. A method for testing a read-only memory (ROM) for at least one non stuck-at fault, the method comprising:
generating a golden value of a victim cell, wherein the golden value corresponds to an uncorrupted data value of the victim cell;
providing a fault-specific pattern through an aggressor cell, wherein the aggressor cell is associated with a plurality of victim cells;
generating a test reading of the victim cell in response to the provided fault-specific pattern;
determining whether the ROM has at least one non stuck-at fault based on a comparison of the golden value and the test reading of the victim cell; and
receiving a test signal for testing the ROM for address decoder open faults.

20. A system-on-chip (SOC) comprising:
a read-only memory (ROM); and
a built-in self test (BIST) unit coupled to the ROM, the BIST unit comprising,
a golden value generator configured to,
provide a golden value of a victim cell;
provide a fault-specific pattern through an aggressor cell, wherein the aggressor cell is associated with at least one victim cell; and
generate a test reading of the victim cell in response to the fault-specific pattern;
and
a fault identification module configured to identify non stuck-at faults in the ROM based at least on the golden value and the test reading of the victim cell, wherein the BIST unit receives test signals for testing the ROM for address decoder open faults.

* * * * *